United States Patent [19]

Rhode

[11] 4,278,898
[45] Jul. 14, 1981

[54] FREQUENCY COMPARATOR FOR ELECTRONIC CLOCKS

[75] Inventor: James B. Rhode, San Diego, Calif.

[73] Assignee: The United States of America as represented by the Secretary of the Navy, Washington, D.C.

[21] Appl. No.: 66,271

[22] Filed: Aug. 13, 1979

[51] Int. Cl.³ .............................................. H03K 21/00
[52] U.S. Cl. .............................. 307/528; 307/221 R; 328/133
[58] Field of Search ...................... 307/233 R, 221 R; 328/133

[56] References Cited

U.S. PATENT DOCUMENTS

| | | | |
|---|---|---|---|
| 2,827,566 | 3/1958 | Lubkin | 307/233 |
| 3,518,555 | 6/1970 | Konotchick | 307/233 |
| 3,750,035 | 7/1973 | Crow | 307/233 |
| 3,857,103 | 12/1974 | Grazia | 307/233 R |

*Primary Examiner*—Harold A. Dixon
*Attorney, Agent, or Firm*—Richard S. Sciascia; Ervin F. Johnston; Harvey Fendelman

[57] ABSTRACT

A device for comparing the frequency of the output signals of a plurality of electronic clocks such as cesium beam time and frequency standards. A plurality of circular shift registers are loaded with identical binary patterns which are circularly clocked through the shift registers by the electronic clocks under test. Logic gates at the outputs of the circular shift registers detect the coincidence of the bit patterns during preselected intervals. As long as the outputs of these logic gates indicate a coincidence during the preselected interval, a holdover multivibrator at the output of each logic gate holds its output at a predetermined level. If a coincidence does not occur during the predetermined interval thereby indicating an error in one of the electronic clocks, the associated holdover multivibrator will change its output condition. This change in output condition of the holdover multivibrator results in the switching of a switching network connected at the output of each holdover multivibrator. A set of logic gates are connected to the outputs of the switching networks such that a failure or an error in any of the electronic clocks is indicated by the appearance of an output signal from the logic gate associated with the electronic clock that is in error.

11 Claims, 3 Drawing Figures

FREQUENCY COMPARATOR FOR ELECTRONIC CLOCKS

BACKGROUND OF THE INVENTION

The present invention relates to frequency comparison circuit arrangements and particularly to frequency comparators in which a predetermined difference between a plurality of pulse repetition frequencies is indicated.

Currently there are no shipboard techniques in use for detecting frequency errors in the output signals of electronic clocks such as cesium beam time and frequency standards except by observing the degraded operation of equipments supplied by the standards or clocks. When a failure is detected in this manner the defective standard or clock is manually patched out of the system and replaced with a backup unit. This procedure results in excessive down time of equipment supported by the electronic clocks or standards and often necessitates resynchronizing of the devices relying on the clocks or standards.

SUMMARY OF THE INVENTION

The present invention relates to a technique and apparatus for comparing the frequency of the output signals of electronic clocks such as cesium beam time and frequency standards. The technique and apparatus disclosed in the present invention operates by causing a binary pattern to be circulated through a plurality of circular shift registers at rates determined by the clock signals under test and by continually testing the relative position of the binary patterns in the shift registers. A shift of one of the patterns relative to the others is an indication of frequency error in the corresponding clock. The present invention will thus allow automatic selection of the precise electronic clocks utilized aboard ships and in a variety of synchronized systems. The present invention will also permit continuous communication over synchronous channels and will virtually eliminate down time resulting from interruption in the service of equipments utilizing synchronizing clocks.

OBJECTS OF THE INVENTION

Accordingly it is the primary object of the present invention to disclose a technique and apparatus for automatically comparing the output frequencies of two or more electronic clocks for the purpose of detecting frequency errors in one of the clocks.

It is an additional object of the present invention to disclose an apparatus that will automatically monitor the performance of highly precise electronic clocks and thereby eliminate a significant portion of the down time that would otherwise be associated with the failure of one or more of such electronic clocks.

Other objects and many of the attendant advantages of this invention will be readily appreciated as the same becomes better understood by reference to the following detailed description when considered in connection with the accompanying drawings.

DESCRIPTION OF THE PREFERRED EMBODIMENT

Figure 1:
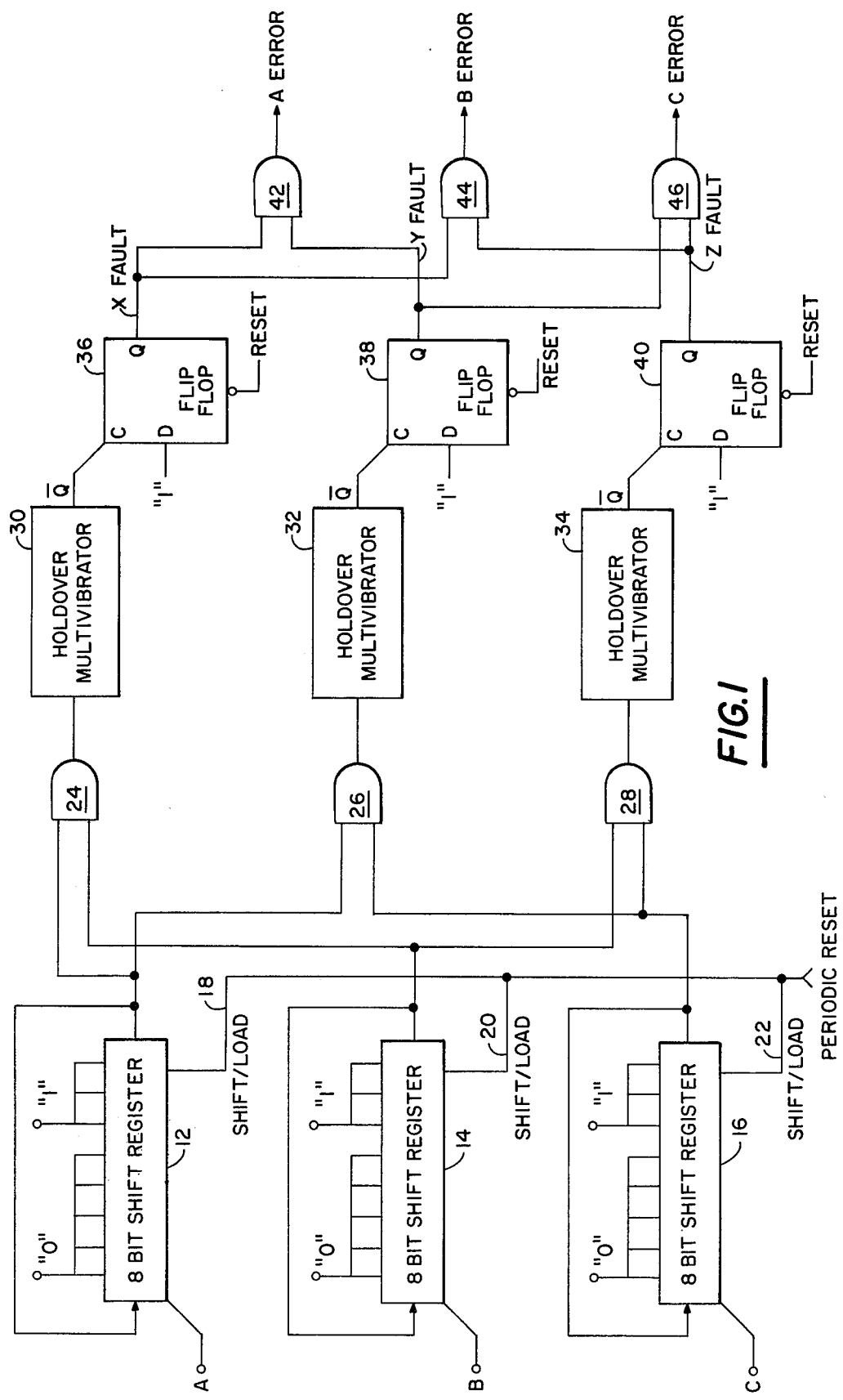
FIG. 1 is a schematic block diagram of the frequency comparator of the present invention.

Referring now to FIG. 1 there is illustrated the preferred embodiment of the present invention. For purposes of this description, the embodiment of the present invention illustrated in FIG. 1 is shown with provision for the comparison of the clock outputs of three electronic clocks which may, for example, be cesium beam time and frequency standards. It is to be understood, however, that the present invention is not limited to the employment of or the comparison between three electronic clocks but may be used to compare the outputs of two or more clock outputs. The comparator inputs are taken at terminals A, B and C. These terminals are provided for receiving the clock outputs of the electronic clocks. It is presumed that the clock outputs under test are intended to operate at precisely the same rate. These terminals A, B and C are connected to the clock inputs, respectively, of the shift registers 12, 14, and 16. In the preferred embodiment the shift registers 12, 14 and 16 are 8-bit shift registers and are initially each parallel loaded with the binary sequence 00000111. This loading is accomplished by the application of a periodic reset pulse to the shift/load inputs 18, 20, and 22.

The output of each shift register is connected to its input to recirculate the contents and the outputs of each pair of shift registers are connected to a 2-input AND gate. Thus, for the frequency comparator illustrated in FIG. 1 there are provided three AND gates 24, 26 and 28. AND gate 24 has its inputs connected to the outputs of shift registers 12 and 14, AND gate 26 has its inputs connected to the outputs of shift registers 12 and 16, and AND gate 28 has its two inputs connected to the outputs of shift registers 14 and 16. Holdover multivibrators 30, 32 and 34 are connected to the respective outputs of AND gates 24, 26 and 28. The holdover multivibrators 30, 32 and 34 are designed to hold their output for a period of time slightly longer than the period of time required for a binary digit to cycle through one of the shift registers. Each of the holdover multivibrators 30, 32 and 34 has its output connected, respectively, to one of the inputs of flip-flops 36, 38, and 40. Finally, a set of output AND gates 42, 44 and 46 are connected as illustrated to the outputs of the flip-flops 36, 38 and 40 such that each of the AND gates 42, 44 and 46 is connected to two of the flip-flops 36, 38 and 40. Indicators (not shown) such as alarms or signal lights may be connected to the output AND gates 42, 44 and 46 to signal when a frequency error has been detected.

Figure 2:
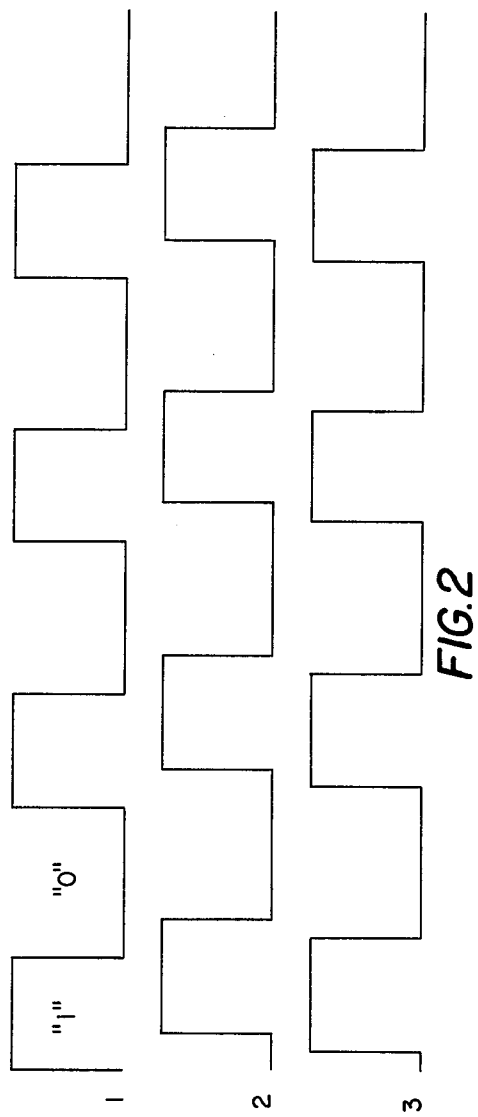
FIG. 2 is a timing diagram of three sample clock pulses where there is a "no error" condition.
Figure 3:
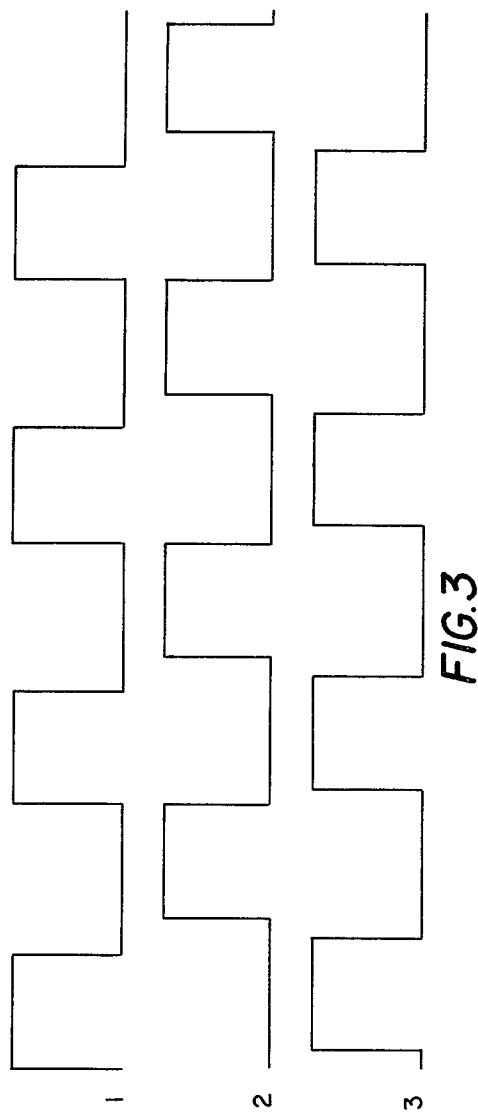
FIG. 3 is a timing diagram of three representative electronic clock pulses where there is a timing error.

The operation of the frequency comparator of the present invention will now be described. The cycle is initiated by the application of a periodic reset pulse to the shift/load inputs 18, 20 and 22 of the three shift registers 12, 14 and 16. This loads each of the shift registers with the binary pattern 00000111. Removal of the periodic reset pulse allows this pattern to be clocked through the shift registers 12, 14 and 16 in a circular fashion at a rate determined by the clock signals at the input terminals A, B and C. Each clock pulse causes a shift of one position to the right with the output being folded back into the input as illustrated. As long as the clock signals at the input terminals A, B and C occur at the same rate, the bit patterns will cycle through the shift registers 12, 14 and 16 together and there will be a time during each cycle when the output of all three registers is in the "1"

state. This is shown in the timing diagram in FIG. 2. If one of the clock signals exhibits a frequency error, the cycle rate of the bit pattern in the corresponding shift register will be faster or slower than the other two. An example of this is illustrated in FIG. 3 in which the input frequency at terminal B is too slow. This causes the "1's" in the bit pattern circulating through the shift register 14 to fall behind the bit patterns in registers 12 and 16. This continues until the "1's" in the bit pattern in register 14 are not coincident with either of the other two registers 12 and 16. This condition will be recognized as a frequency error in the frequency at terminal B by the remaining circuitry as follows.

The two input AND gates 24, 26 and 28 are used to detect coincidence of each pair of shift register outputs. When both inputs to an AND gate are "1", indicating coincidence of the "1's" in the bit pattern of the shift registers connected to it, the output will, likewise, be a "1". In the absence of an error in frequency this condition will occur every eight cycles of the input clock signal. At this point it is to be understood that although 8-bit shift register have been illustrated and described and although the bit pattern 00000111 has been utilized in the preferred embodiment herein, different size shift registers and/or bit patterns may also be used within the scope of the present invention. In the embodiment described herein, three "1's" are used in the bit pattern to provide two periods of leeway in indicating an error. More or less "1's" could be used as desired or required. As long as the outputs of AND gates 24, 26 and 28 go to "1" every eight cycles, holdover multivibrators 30, 32 and 34 will remain triggered such that the Q outputs thereof will be at the "0" level. If, however, and by way of example, the condition of FIG. 3 exists, the outputs of AND gates 24 and 28 will no longer go to "1" every eight cycles and this will allow multivibrators 30 and 34 to revert to the quiescent state. When this happens the Q outputs of 30 and 34 will go to the "1" state which will strobe flip-flops 36 and 40 causing the X fault and the Z fault lines to go to the "1" state. These signals are connected to the AND gate 44 and will thereby cause a "1" to appear at the B frequency error output of AND gate 44. Likewise, a "1" will appear at the "A" or "C" frequency error outputs if the "A" or "C" input frequency is in error.

It is to be understood that any logic such as TTL that is compatible with the clock frequencies under test may be used for the logic gates of the present invention. Obviously, many other modifications and variations of the present invention are possible in the light of the above teachings. It is therefore to be understood that within the scope of the appended claims the invention may be practiced otherwise than as specifically described.

What is claimed is:

1. An apparatus for indicating a frequency error in one of a plurality of electronic clocks comprising:
    n input terminals, each for connection to one of said plurality of electronic clocks;
    n shift registers each having an output and being connected to one of said n input terminals;
    n logic gates;
    each pair of said shift register outputs being connected to one of said n logic gates;
    n multivibrators, each being connected to the output of one of said n logic gates; and
    a plurality of switching means, each being connected to one of said n multivibrators, for providing an indication of which of said plurality of clocks has a frequency error.

2. The apparatus of claim 1 wherein each of said n shift registers has its output connected to its input.

3. The apparatus of claim 1 wherein each of said n logic gates is an AND gate.

4. The apparatus of claim 3 wherein each of said n multivibrators comprises a holdover multivibrator that holds its output in the ON condition for a predetermined period of time in the absence of a trigger pulse at its input and then returns its output to the OFF condition.

5. The apparatus of claim 1 wherein said switching means comprises:
    n flip-flops, each being connected to one of said n multivibrators; and
    a second set of AND gates each being connected to two of said n multivibrators.

6. The apparatus of claim 1 wherein each of said shift registers is loaded with the bit sequence 00000111.

7. A device for indicating a frequency error in one of n electronic clocks comprising:
    n shift register means, each for receiving the output of a different one of said n electronic clocks and for shifting an identical bit sequence therethrough at a rate determined by said one of said electronic clocks;
    n means for detecting the coincidence of each pair of the outputs of said n shift register means, each of said n means for providing a distinct output upon the detection of each said coincidence;
    n multivibrators each being connected to the output of one of said n coincidence detecting means; and
    a plurality of switching means connected to said n multivibrators for providing an indication of which of said n electronic clocks has a frequency error.

8. The device of claim 7 wherein said n shift register means comprises n 8-bit shift registers each having loaded therein the bit sequence 00000111.

9. The device of claim 8 wherein each of said n shift register means comprises a shift register having its output connected to its input for recirculating the contents therein.

10. The device of claim 9 wherein said n coincidence detecting means each comprises an AND gate.

11. The device of claim 10 wherein said switching means comprises:
    n flip-flop circuits each being connected to one of said n multivibrators; and
    n AND gates each connected to a different pair of said n flip-flop circuits.

* * * * *